United States Patent
Nagasue

(10) Patent No.: US 6,949,973 B2
(45) Date of Patent: Sep. 27, 2005

(54) SIGNAL AMPLIFIER

(75) Inventor: Makoto Nagasue, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 51 days.

(21) Appl. No.: 10/766,191

(22) Filed: Jan. 29, 2004

(65) Prior Publication Data

US 2005/0068100 A1 Mar. 31, 2005

(30) Foreign Application Priority Data

Sep. 25, 2003 (JP) ........................................ 2003-333677

(51) Int. Cl.[7] .............................................. H03F 1/14
(52) U.S. Cl. ........................... 330/51; 330/10; 330/251; 330/207 A
(58) Field of Search ........................ 330/10, 51, 207 A, 330/251, 255, 262

(56) References Cited

U.S. PATENT DOCUMENTS

| | | | | | |
|---|---|---|---|---|---|
| 6,016,075 | A | * | 1/2000 | Hamo | 330/10 |
| 6,229,389 | B1 | * | 5/2001 | Pullen et al. | 330/10 |
| 6,313,697 | B1 | * | 11/2001 | Neuteboom et al. | 330/10 |
| 6,536,377 | B2 | * | 3/2003 | Beaver | 119/859 |
| 6,812,785 | B2 | * | 11/2004 | Masuda et al. | 330/10 |
| 6,831,508 | B2 | * | 12/2004 | Shima | 330/10 |

FOREIGN PATENT DOCUMENTS

JP  2001-223537  8/2001

* cited by examiner

Primary Examiner—Michael Tokar
Assistant Examiner—Khai M. Nguyen
(74) Attorney, Agent, or Firm—Rabin & Berdo, P.C.

(57) ABSTRACT

There is provided a signal amplifier capable of restraining the influence of an EMI caused by a distortion of a waveform of an output signal. The signal amplifier comprises an inverter circuit made up of p-channel and n-channel transistors, reference circuits having a circuit configuration corresponding to the inverter circuit and made up of p-channel and n-channel transistors, a selection circuit for selecting the p-channel and n-channel transistors independently with each other with the same combination as the combination of the selection of the p-channel and n-channel transistors in the inverter circuit and the reference circuits, and a selection control circuit for comparing first driving capacity of the p-channel transistor selected in the first reference circuit with second driving capacity of the n-channel transistor selected in the second reference circuit and controlling the selection circuit so as to achieve a balance between the first driving capacity and the second driving capacity on the basis of the result of comparison.

7 Claims, 4 Drawing Sheets

SIGNAL AMPLIFIER

FIELD OF THE INVENTION

The invention relates to a signal amplifier, particularly, to a signal amplifier provided with an inverter circuit comprised of inverters made up of p-channel transistors and n-channel transistors which are connected to each other in multiple stages.

This application is counterpart of Japanese patent application, Serial Number 333677/2003, filed Sep. 25, 2003, the subject matter of which is incorporated herein by reference.

BACKGROUND OF THE INVENTION

A D-class signal amplifier of low power consumption (D-class amplifier) is mainly used as a power driving circuit for driving a speaker. Such a D-class signal amplifier is comprised of CMOS inverters connected to each other in multiple stages each made up of n-channel and p-channel MOS transistors, and it is driven by a PWM control. In the case of outputting a PWM waveform by connecting the CMOS inverters to each other in multiple stages, the PWM output signal includes a phase component which is determined by a power center other than an amplitude component which is determined by a pulse width, wherein if the PWM waveform at rise time is different from that at fall time, there is a likelihood of the occurrence of the displacement of the power center, causing a problem that an output signal to the speaker is distorted.

In a BTL system for outputting waveforms which are displaced by 180 degrees in phase between a +side input line of a speaker and a –side input line thereof, noises at overshoot/undershoot of a PWM output signal or at rise time and that at fall time and so forth are cancelled by a stray capacitor between the +side input line and the –side input line, and electromagnetic waves caused by current fluctuation at the +side input line and the –side input line are also cancelled each other. The cancellation of the noises and electromagnetic waves is found that the closer the waveform of the PWM output signal at the rise is relative to the waveform thereof at the fall, the more effect is achieved while the larger the difference between these waveforms is, the less effect is achieved.

The waveform of the PWM output signal at the rise and the same at the fall depend on a driving capacity of the p-channel transistor and the n-channel transistor, and if the driving capacities of the p-channel transistor and n-channel transistor are different from each other, there occurs a difference between the rise and the fall of the PWM output signal. Meanwhile, the driving capacities of the p-channel and n-channel transistors are varied in the fabrication thereof, and hence there occurs a problem that a large difference between the waveform at the rise and that at the fall according to a fabrication lot in a conventional D-class signal amplifier, and also the distortion of waveforms becomes large so as to largely influence upon an EMI (Electro Magnetic Interference).

JP-A 2001-223537 (page 2 to 4, FIGS. 1 to 3) discloses a D-class signal amplifier having a function of adjusting an output waveform to be supplied to a speaker. According to this D-class signal amplifier, the number of selection of the CMOS inverters is increased or decreased, thereby adjusting the output waveform to the speaker.

According to this D-class signal amplifier as disclosed in JP-A 2001-223537, there is a problem that the number of selection is changed by a unit of a transistor pair made up of p-channel and n-channel transistors, thereby increasing or decreasing the number of selection of the p-channel and n-channel transistor at the same time, and in the case where there is a difference between the driving capacity of the p-channel transistor and that of the n-channel transistor, it is difficult to achieve the balance therebetween, so that there occurs a large difference between the output waveform at the rise and that at the fall, and the distortion of the waveforms becomes large to influence upon the EMI.

SUMMARY OF THE INVENTION

It is an object of the invention to provide a signal amplifier capable of restraining influence of an EMI caused by a waveform distortion of an output signal. To achieve the above object, the signal amplifier comprises an inverter circuit, first and second reference circuits, selection circuit, and a selection control circuit. The inverter circuit is structured by sub-inverters connected to each other in multiple stages and made up of p-channel transistors and n-channel transistors. The first and second reference circuits each have a circuit configuration corresponding to the inverter circuit and structured by sub-inverters connected to each other in multiple stages and made up of p-channel transistors and n-channel transistors. The selection circuit independently select the p-channel or the n-channel transistor from each other with same combination as the combination of the selection of the p-channel and n-channel transistors in the inverter circuit and first and second reference circuits. The selection control circuit compares a first driving capacity serving as a driving capacity of the p-channel transistor selected in the first reference circuit with a second driving capacity serving as a driving capacity of the n-channel transistor selected in the second reference circuit, and outputting a control signal to the selection circuit so as to achieve a balance between the first driving capacity and the second driving capacity based on the result of comparison, thereby controlling said selection signal. The selection circuit controls operations of the p-channel transistors and the n-channel transistors in the inverter circuit in response to an input signal of the inverter circuit and the control signal outputted from the selection control circuit.

According to the signal amplifier of the invention, each driving capacity of the p-channel and n-channel transistors constituting the inverter circuit is detected by the reference circuit which provided separately from the inverter circuit and compared with each other, wherein if there is a difference between the driving capacity of the p-channel transistor and that of the n-channel transistor, the number of selection of the p-channel transistor or n-channel transistor is independently increased or decreased. Accordingly, even if there is a variation in fabrication between the driving capacity of the p-channel transistor and that of the n-channel transistor, these driving capacities can be automatically balanced with each other, so that the waveform at the rise and that at the fall which depends on each driving capacity of the p-channel and n-channel transistors are rendered close to each other. As a result, the influence of the EMI caused by the distortion of the waveforms of the output signals in the signal amplifier can be reduced.

PREFERRED EMBODIMENT OF THE INVENTION

Figure 1:
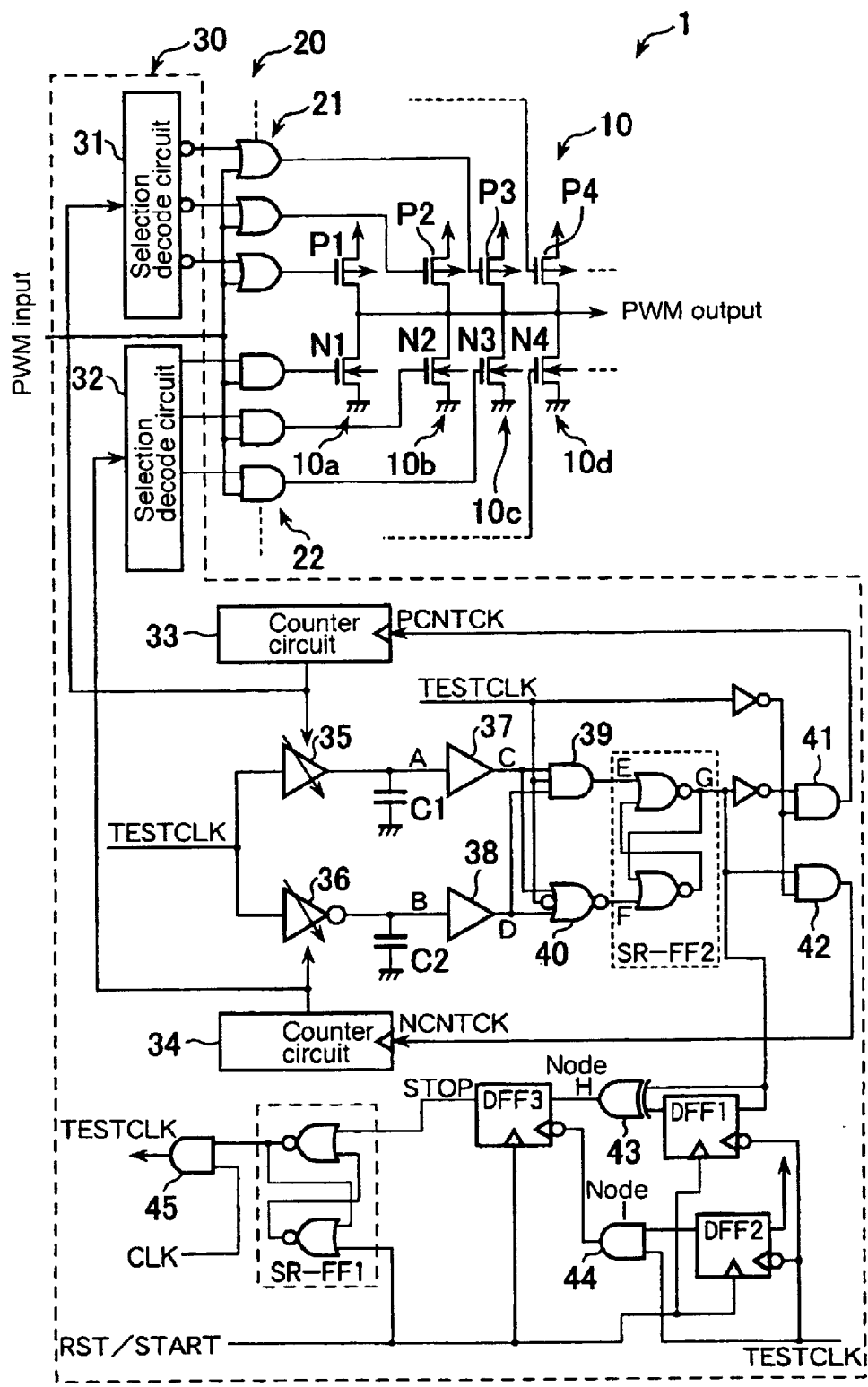
FIG. 1 is an electric circuit diagram of a signal amplifier according to a first embodiment of the invention.

First Embodiment:

FIG. 1 is an electric circuit diagram of a signal amplifier according to a first embodiment of the invention. A signal amplifier 1 is described here as a D-class signal amplifier for amplifying an input signal having a PWM waveform to output an output signal of the same waveform. The signal amplifier 1 comprises an inverter circuit 10, a selection circuit 20, and a selection control circuit 30, wherein the driving capacity of the p-channel transistors and the driving capacity of the n-channel transistors of the inverter circuit 10 respectively are adjusted to be balanced therebetween by the selection circuit 20 and the selection control circuit 30.

The inverter circuit 10 comprises CMOS inverters (sub inverters) 10a, 10b, ... connected to each other in multiple stages and made up of p-channel and n-channel transistors. The selection circuit 20 comprises OR circuits 21 connected to gate terminals of the p-channel transistors P1, P2, ..., and AND circuits 22 connected to gate terminals of the n-channel transistors N1, N2, ....

The inverter circuit 30 compares a driving capacity of the selected p-channel transistor with that of the selected n-channel transistor, and decides as to whether the number of selection of either the p-channel or n-channel transistors is decreased or not on the basis of the result of comparison, and outputs a control signal to the selection circuit 20 so as to decrease the number of selection of either the p-channel or n-channel transistors on the basis of the result of decision. The configuration of the selection control circuit 30 is now described concretely.

The reference circuits 35, 36 have circuit configurations corresponding to the inverter circuit 10 and comprise inverter circuits comprised of sub-inverters connected to each other in multiple stages and made up of the p-channel transistor and n-channel transistors, that is, they are structured to be the same as the inverter circuit 10 or to be contracted in size of the inverter circuit 10, and they are provided separately from the inverter circuit 10. The reference circuits 35, 36 are driven in response to a test clock signal TESTCLK, and outputs a signals having pulse waveform in response to the test clock signal TESTCLK. Further, the reference circuits 35, 36 are changed in driving capacity when a selection state thereof is changed (so as to be the same selection as the combination as the combination in the inverter circuit 10) associated with the selection of the p-channel or n-channel transistors in the inverter circuit 10, and hence the signals having pulse waveforms of the output signal of the reference circuits 35, 36 are changed.

The capacitors C1, C2 blunt the rise and fall of the signals having pulse waveforms of the output signals of the reference circuits 35, 36, and buffers 37, 38 rectify the blunted waveforms into ideal pulse waveforms with a predetermined threshold voltage. An AND circuit 39 outputs a short pulse waveform in response to the output pulse waveforms of the buffers 37, 38 and the test clock signal TESTCLK in the case where rise time of the pulse of the buffer 37 is earlier than fall time of the output pulse of the buffer 38, namely, in the case where the driving capacity of the p-channel transistor is higher than that of n-channel transistor. A NOR circuit 40 outputs a short pulse waveform in the case where fall time of the output pulse of the buffer 38 is earlier than rise time of the output pulse of the buffer 37, namely, in the case where the driving capacity of the n-channel transistor is higher than that of the p-channel transistor. The flip-flop SR-FF2 outputs L level in the case where a short pulse waveform is outputted from the AND circuit 39, and outputs H level in the case where a short pulse waveform is outputted from the NOR circuit 40. An AND circuit 41 outputs a count signal PCNTCK of H level in the case where the output of the flip-flop SR-FF2 is L level, namely, the driving capacity of p-channel transistor is high upon receipt of an inverting signal serving as the output of the flip-flop SR-FF2 and an inverting signal of the test clock signal TESTCLK. An AND circuit 42 outputs an NCNTCK of "H level" in the case where the output of the flip-flop SR-FF2 level, namely, in the case where the capacity of the n-channel transistor is high upon receipt of the output of the flip-flop SR-FF2 and the inverting signal of the test clock signal TESTCLK. A count circuit 33 counts up +1 every time the count signal PCNTCK goes H level and a count circuit 34 counts up +1 every time the count signal NCNTCK goes H level. The count circuits 33, 34 are initialized to zero when the adjustment of the driving capabilities thereof is started. Selection decode circuits 31, 32 select all the p-channel and n-channel transistors (maximum capability) when the count circuits 33, 34 are initialized. The selection decode circuit 31 outputs a selection signal (control signal) so as to decrease the number of selection of the p-channel transistors every time the count circuit 33 counts up +1. The selection decode circuit 32 outputs the selection signal (control signal) so as to decrease the number of selection of the n-channel transistors every time the count circuit 34 counts up +1.

A D flip-flop DFF1 outputs a state at node G to an exclusive OR circuit 43 upon receipt of a state at node G serving as an output of the flip-flop SR-FF2 every time the test clock signal TESTCLK falls. That is, the D flip-flop DFF1 holds the output state at node G in response to the previous test clock signal TESTCLK until the test clock signal TESTCLK falls. The D flip-flop DFF1 is reset by a reset/start signal RST/START when the adjustment of driving capacity is started. The exclusive OR circuit 43 compares the state at node G in response to the previous time test clock signal TESTCLK held the by D flip-flop DFF1 with the state at node G in response to the present time test clock signal TESTCLK, and outputs L level to node H in the case where the previous state is not changed from present state (in the case where the relation between the driving capacity of the p-channel transistors and that of the n-channel transistors is the same), while it outputs H level to node H when the previous state is changed from the present state (in the case where the relation between the driving capacity of the p-channel and that of the n-channel transistors is reversed) A D flip-flop DFF3 outputs a signal of state at node H every time the signal of state at node I falls. The D flip-flop DFF3 is reset in response to the reset/start signal RST/START when the adjustment of driving capacity is started. The D flip-flop DFF2 is reset in response to the reset/start signal RST/START when the adjustment of driving capacity is started, and outputs a signal of an input state which is always held H level to an AND circuit 44 when the first test clock signal TESTCLK falls. That is, since the D flip-flop DFF2 outputs L level at the time of reset to the AND circuit 44 until the first test clock signal TESTCLK falls, the output of the AND circuit 44 (node I) is held H level even if the first test clock signal TESTCLK rises. Accordingly, in the case where the driving capacity of the n-channel transistor is high in response to the first test clock signal TESTCLK so that the signal at the state at node G goes H level and the output "L level" of the D flip-flop DFF1 at the time of reset is "L level", the state at node I falls from the H level to L level so that a stop signal STOP goes H level, thereby preventing the adjustment of the driving capacity from being terminated. The flip-flop SR-FF1 receives the reset/start signal RST/START and the stop signal STOP. When the reset/start signal RST/START goes H level at the time when the adjustment of driving capacity is started, the D flip-flop DFF3 is reset and the stop signal STOP goes L level so that the output signal of the flip-flop SR-DFF1 goes H level, which is held thereafter until the stop signal STOP goes H level. An OR circuit 45 outputs a clock signal CLK for adjusting driving capacity as the test clock signal TESTCLK on the basis of the output of the flip-flop SR-FF1. The OR circuit 45 is capable of outputting the test clock signal TESTCLK when the reset/start signal RST/START goes H level when the adjustment of driving capacity is started, and outputs the test clock signal TESTCLK until the stop signal STOP goes H level. The OR circuit 45 stops the outputting of the test clock signal TESTCLK when the stop signal STOP goes H level, and continues the stopping state until the reset/start signal RST/START goes H level.

Figure 2:
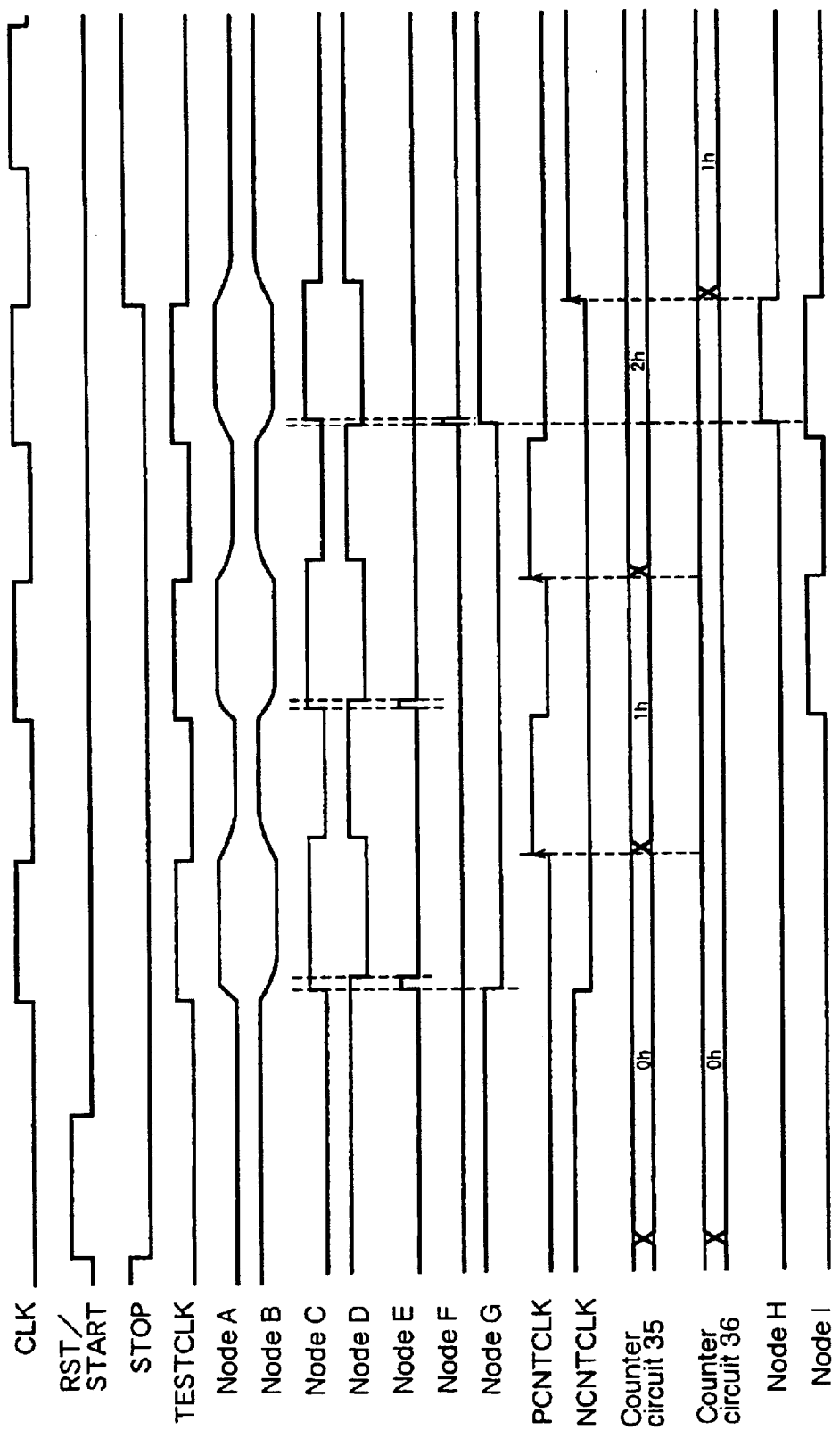
FIG. 2 is a timing chart showing a case where a driving capacity of a p-channel transistor is high.

FIG. 2 is a timing chart showing signal waveforms of each component when the driving capacity of the p-channel transistor is high.

When the reset/start signal RST/START goes H level, the count values of the count circuits 33, 34 are initialized to zero so that the selection decode circuits 31, 32 are initialized to select all the transistors. When reset/start signal RST/START goes H level, the D flip-flops DFF1 to DFF3 are reset and the output of the flip-flop SR-FF1 goes H level, so that the test clock signal TESTCLK can be outputted. Thereafter, the adjustment operation is started when the reset/start signal RST/START goes L level.

Figure 3:
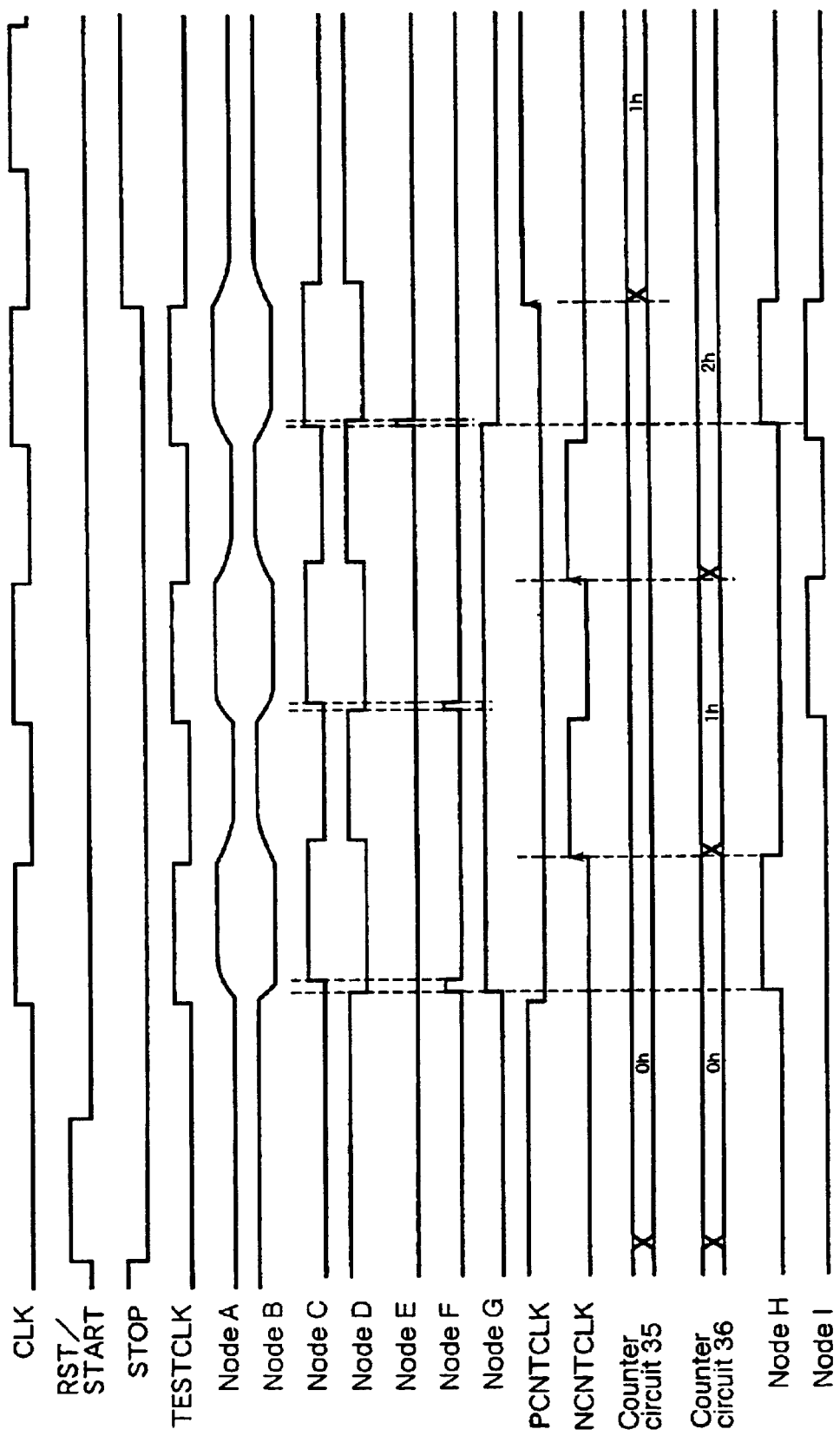
FIG. 3 is a timing chart showing a case where a driving capacity of a n-channel transistor is high.

When the test clock signal TESTCLK is outputted, the pulse waveforms which are blunted by the influence of the capacitors C1, C2 are outputted from the reference circuits 35, 36 to nodes A and B. These pulse waveforms are once rectified to the ideal pulse waveforms by the buffers 37, 38, and outputted to nodes C and D. In this case, since the driving capacity of the p-channel transistor is large, rise time of the pulse waveform at node C is earlier than fall time of the pulse waveform at node D. In this case, a short pulse waveform is outputted from the AND circuit 39 to node E. The pulse waveform at node E goes H level during fall time of the pulse waveform at node C and fall time of the pulse waveform at node D. Incidentally, if the driving capacity of the n-channel transistor is large as shown in FIG. 3, fall time of the pulse waveform at node D is earlier than fall time of the pulse waveform at node C so that a short pulse waveform is outputted from the NOR circuit 40 to node F. The pulse waveform at node F is held H level during fall time of the pulse waveform at node D and rise time of the pulse waveform at node C. That is, when the driving capacity of the p-channel transistor is high, the short pulse waveform is outputted to node E while when the driving capacity of the n-channel transistor is high, the short pulse waveform outputted to node F.

When the short pulse waveform is outputted to node E, the flip-flop SR-FF2 is reset and the signal at node G goes L level. When the signal at node G is L level, the count signal PCNTCK of "H level" is outputted from the AND circuit 41 at the timing when the test clock signal TESTCLK falls, so that the count circuit 33 counts up +1, and the count value is inputted to the selection decode circuit 31. The selection decode circuit 31 outputs the selection signal so as to decrease the number of selection of p-channel transistors by one. Further, the count value of the count circuit 33 is also inputted to the reference circuit 35 so as to update the selection of the p-channel transistor in the reference circuit 35 associated with the selection in the selection decode circuit 31, namely, so as to be the same combination as the combination of the selection of the p-channel transistors in the inverter circuit 10.

As illustrated in FIG. 2, the processings which are the same as set forth above are repeated even in response to the same time test clock signal TESTCLK, and the p-channel transistors are continuously decreased by one. Since the relation of the driving capacity is reversed in response to the third time test clock signal TESTCLK, the driving capacity of the n-channel transistor becomes large, a short pulse waveform is outputted to node F so that the flip-flop SR-FF2 is set to output H level to node G while the count signal NCNTCK of "H level" is outputted at the timing when the third time test clock signal TESTCLK falls. The count circuit 34 counts up +1 owing to the count signal NCNTCK of "H level", and this count value is inputted to the selection decode circuit 32. The selection decode circuit 32 outputs the selection signal so as to decrease the number of selection of the n-channel transistors by one. Further, the count value of the count circuit 34 is also inputted to a reference circuit 36, and the selection of the n-channel transistor in the reference circuit 36 is updated associated with the selection in the selection decode circuit 32, namely, so as to be the same combination as the combination of the selection of the n-channel transistors in the inverter circuit 10.

The exclusive OR circuit 43 outputs H level to node H owing to the "H level" state at node G which is held as an output of the D flip-flop DFF1 in response to the second time test clock signal TESTCLK and the state of "H level" at node G in response to the third time test clock signal TESTCLK, the stop signal STOP goes H level and the output of the flip-flop SR-FF1 goes L level at the timing of fall of a signal at node I associated with fall time of the third time test clock signal TESTCLK, whereby the output of the test clock signal TESTCLK is stopped to terminate the adjustment.

As mentioned above, in the case where the driving capacity of the p-channel transistor is high, the number of the p-channel transistors is decreased by one every time the count circuit 33 counts up +1, and adjustment of driving capacity is terminated at the time when the relation between the driving capacity of the p-channel transistor and that of the n-channel transistor is reversed. Although the adjustment of driving capacity is terminated by decreasing the number of n-channel transistor by one in response to the third time test clock signal TESTCLK opposite to the case where the p-channel transistor is decreased in driving capacity, there is no problem in that the p-channel driving capacity is forced to close to that of the n-channel transistor.

FIG. 3 is a timing chart showing signal waveforms of each component when the driving capacity of the p-channel transistor is high.

In this case, since the driving capacity of the n-channel transistor is high to the contrary to the case shown in FIG. 2, a short pulse waveform is outputted to node F in response to the first clock signal TESTCLK, whereby the flip-flop SR-FF2 is set to output H level to node G, and the count signal NCNTCK of "H level" is outputted at the timing when the first time test clock signal TESTCLK falls. The count circuit 34 counts up +1 in response to the count signal NCNTCK of "H level", and this count value is inputted to the selection decode circuit 32. The selection decode circuit 32 outputs the selection signal so as to decrease the number of selection of the n-channel transistors by one. Further, the count value of the count circuit 34 is also inputted to the reference circuit 36, whereby the selection of the n-channel is effected in the reference circuit 36 associated with the selection of the selection decode circuit 32, namely, so as to be the same combination as the combination of the selection of the n-channel transistors in the inverter circuit 10. When a signal goes H level at node G in response to the first time test clock signal TESTCLK, the signal at node H goes H level owing to the output of H level at node G and the output of L level when the D flip-flop DFF1 is reset, but the signal at node I is held L level by the D flip-flop DFF2 and the AND circuit 44 so that the stop signal STOP does not go H level by the D flip-flop DFF3. Accordingly, the stop signal STOP goes H level owing to the H level at node G and L level when the D flip-flop DFF1 is reset before the driving capacities are balanced, thereby preventing the adjustment processing from being terminated.

When the number of selection of the n-channel transistors is decreased by one even in response to the second time test clock signal TESTCLK, and the relation between the driving capacity of the p-channel transistor and that of the n-channel transistor is reversed in response to the third time test clock signal TESTCLK to allow the driving capacity of p-channel transistor high, a short pulse waveform is outputted to node E. Accordingly, the flip-flop SR-FF2 is reset and the signal at node G goes L level, and the count signal PCNTCK of "H level" is outputted from the AND circuit 41 at the timing when the test clock signal TESTCLK falls, so that the count circuit 33 counts up +1 and the count value is inputted to the selection decode circuit 31. The selection decode circuit 31 outputs the selection signal so as to decrease the number of selection of the p-channel transistors by one. The count value of the count circuit 33 is also inputted to the reference circuit 35, thereby updating the selection of p-channel transistor in the reference circuit 35 associated with the selection by the selection decode circuit 31, namely, so as to be the same combination as the combination of the selection of the p-channel transistors in the inverter circuit 10.

At this time, the exclusive OR circuit 43 outputs H level to node H by the state of "H level" at node G which is held as an output of the D flip-flop DFF1 in response to the second time test clock signal TESTCLK, and the state of "L level" at node G in response to the third time test clock signal TESTCLK, while the stop signal STOP goes H level, the output of the test clock signal TESTCLK to terminate the adjustment at the timing of fall of the signal at node I associated with fall time of the third time test clock signal TESTCLK.

As mentioned above, when the driving capacity of the n-channel transistor is high, the number of selection of the n-channel transistor is decreased by one every time the count circuit 34 counts up +1, and the adjustment of driving capacity is terminated at the time when the relation between the driving capacity of the p-channel transistor and that of the n-channel transistor is reversed. Although the adjustment of the driving capacity of the p-channel transistor by one is terminated to the contrary to the case where the driving capacity of the n-channel transistor is reduced in response to the third time test clock signal TESTCLK, there is no problem that the driving capacity of the p-channel transistor is brought to close to that of the n-channel transistor.

Although the selection decode circuits 31, 32 select all the transistors to render them to have the maximum capability in the case where the count values of the count circuits 33, 34 are initialized to zero, it is not always necessary to select all the transistors but a plurality of p-channel and n-channel transistors may be selected.

Although it is structured in the present embodiment that the reference circuits are provided separately from the inverter circuit 10, and the test clock signal TESTCLK is inputted to the reference circuits 35, 36, thereby detecting the driving capacity of the p-channel transistor and that of the n-channel transistor, it may be structured that the output voltage waveforms of the p-channel and n-channel transistor in the inverter circuit 10 are detected and they may be inputted to node A. In this case, it is not necessary to separately provide the reference circuits 35, 36, thereby simplifying the circuit configuration.

Although the present embodiment described the case of D-class signal amplifier, the invention can be applied to the A type, B class and C class signal amplifiers.

According to the present embodiment, even if there occurs variations in the driving capacity of the p-channel and n-channel transistors constituting the inverter circuit 10 in the fabrication thereof, the driving capacity of the p-channel transistor is compared with that of the n-channel transistor, and the number of selection of the transistors at the side where the driving capacity is large is reduced to bring the driving capacity of the p-channel close to that of the n-channel transistors (so as to balance each other). As a result, the distortion of waveforms caused by difference of waveforms at the timing of rise and fall of PWM output from the signal amplifier can be restrained. Further, in the case of outputting the PWM output to a speaker and so forth by the BLP system, noises at overshoot/undershoot of the signal and so forth at rise time and fall time are prone to be cancelled by placing the +side input line in parallel with the –side input line, and also electromagnetic wave caused by the change of current which flows to the +side and –side input lines are also prone to be cancelled, thereby improving the EMI characteristics.

According to the signal amplifier of this embodiment, the adjustment of the driving capacity of the signal amplifier 1 is started in response to the reset/start signal RST/START, and it is automatically terminated when the stop signal STOP goes H level so that the manual adjustment operation is dispensed with, thereby achieving cost down.

Second Embodiment

Figure 4:
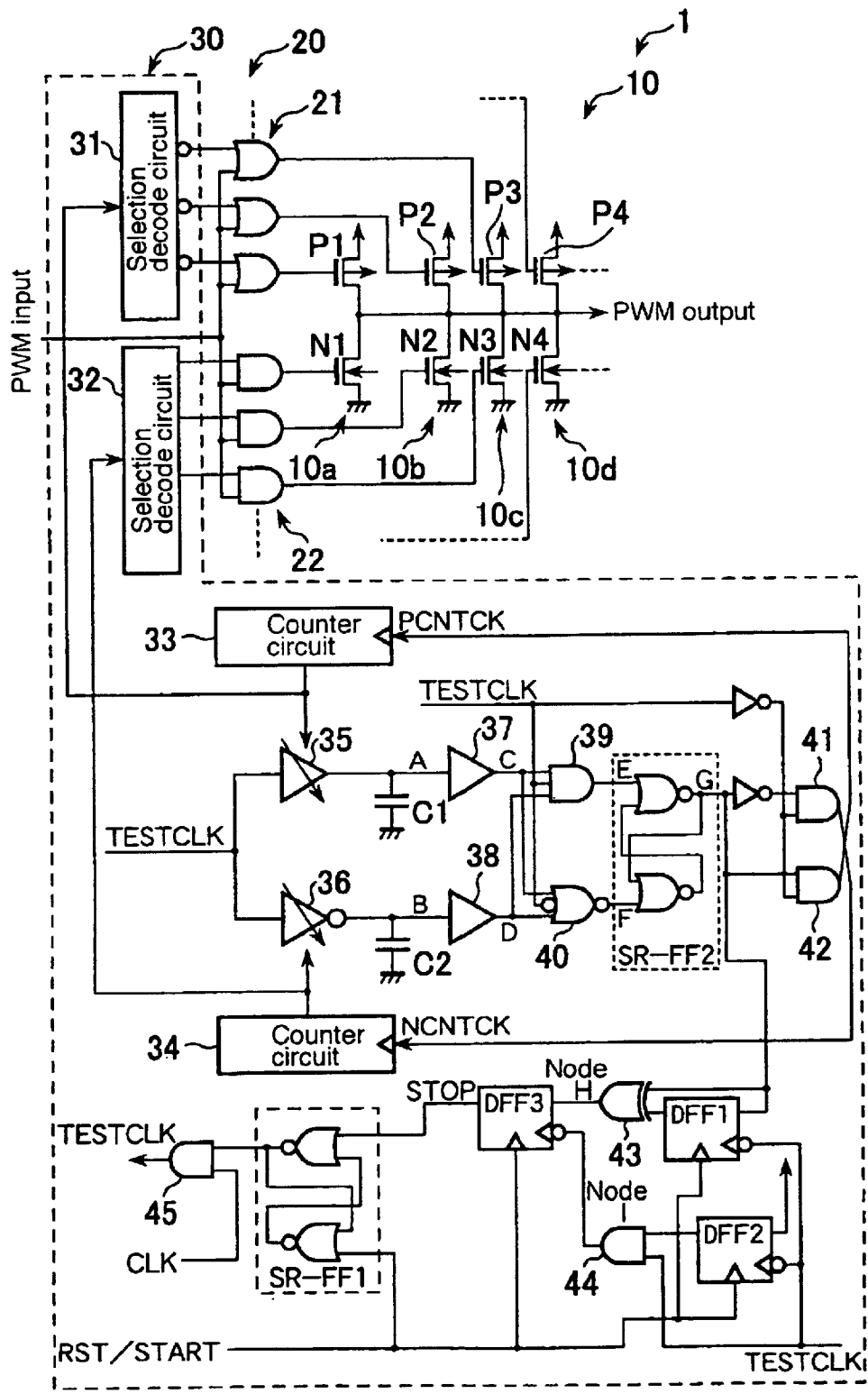
FIG. 4 is an electric circuit diagram of a signal amplifier according to a second embodiment of the invention.

FIG. 4 is an electric circuit diagram of a signal amplifier 1 according to a second embodiment of the invention. The second embodiment is different from the first embodiment in that an output of an AND circuit 41 becomes a count signal NCNTCK and an output of an AND circuit 42 is a count signal PCNTCK. In the case where count values of count circuits 33, 34 are initialized to zero in response to the reset/start signal RST/START of "H level", selection decode circuits 31, 32 select the p-channel transistor and the n-channel transistor one by one so that the output of the signal amplifier 1 becomes the minimum capability.

In the case where the driving capacity of the p-channel transistor is high, the count signal NCNTCK of "H level" is outputted from the AND circuit 41 to the count circuit 34 so as to count up the count value of +1, thereby increasing the number of selection of the n-channel transistors by one by the selection decode circuit 32. At this time, the count value of the count circuit 34 is also inputted to a reference circuit 36, thereby updating the selection of n-channel transistor in the reference circuit 36 associated with the selection by the selection decode circuit 32, namely, so as to be the same combination as the combination of the selection of the n-channel transistors in the inverter circuit 10.

Meanwhile, in the case where the driving capacity of the n-channel transistor is high, the count signal PCNTCK of "H level" is outputted from the AND circuit 42 to the count circuit 33 to count up the count value of +1, thereby increasing the number of selection of the p-channel transistors by one by the selection decode circuit 31. At this time, the count value of the count circuit 33 is also inputted to the reference circuit 35, thereby updating the selection of p-channel transistor in the reference circuit 35 associated with the selection by the selection decode circuit 31, namely, so as to be the same combination as the combination of the selection of the p-channel transistors in the inverter circuit 10.

That is, according to this embodiment, the count value of the count circuit 33 or 34 is counted up by +1 with a low driving capacity of the p-channel transistor or n-channel transistor, thereby increasing the number of selection of the transistors having low driving capacity.

According to the first embodiment, the driving capacity of the p-channel transistor is brought to close to that of n-channel transistor by decreasing the number of selection of p-channel or n-channel transistors which are high in driving capacity from the maximum capability of the signal amplifier 1, thereby adjusting the output of the signal amplifier 1 to bring to close to the maximum capability, but according to the second embodiment, the number of selection of the p-channel or n-channel transistors which are low in driving capacity 1 is increased in the minimum capability of the signal amplifier so that the driving capacity of the p-channel transistor is brought to close to that of the n-channel transistor, thereby adjusting the output of the signal amplifier 1 to bring to close to the minimum capability. In the second embodiment, in the case where the count values of the count circuits 33, 34 are initialized to zero, the selection decode circuits 31, 32 select the p-channel and n-channel transistors one by one, but it is not always necessary to select one by one, and they may select the p-channel and n-channel transistors by plural number by plural number.

What is claimed is:

1. A signal amplifier comprising:
   an inverter circuit comprised of sub-inverters connected to each other in multiple stages and made up of p-channel transistors and n-channel transistors;
   a reference circuit having a circuit configuration corresponding to said inverter circuit and comprised of sub-inverters connected to each other in multiple stages and made up of p-channel transistors and n-channel transistors;
   a selection circuit for independently selecting the p-channel transistor and the n-channel transistor from each other with the same combination as the combination of the selection of the p-channel and n-channel transistors in said inverter circuit and reference circuit; and
   a selection control circuit for comparing a first driving capacity serving as a driving capacity of the p-channel transistor selected in said reference circuit with a second driving capacity serving as a driving capacity of the n-channel transistor selected in said reference circuit, and outputting a control signal to said selection circuit so as to achieve a balance between the first driving capacity and the second driving capacity based on the result of comparison, thereby controlling said selection signal;
   wherein said selection circuit controls operations of the p-channel transistors and the n-channel transistors in said inverter circuit in response to an input signal of said inverter circuit and the control signal outputted from the selection control circuit.

2. A signal amplifier according to claim 1, wherein said selection control circuit comprises:
   a comparator circuit for comparing the first driving capacity serving as the driving capacity of the p-channel transistor selected in said reference circuit with the second driving capacity serving as the driving capacity of the n-channel transistor selected in said reference circuit;
   a decision circuit for deciding as to whether either the number of selection of the p-channel transistors or the number of selection of the n-channel transistors is changed on the basis of the result of comparison in the comparator circuit; and
   a selection increment/decrement circuit for controlling said selection circuit so as to change either the number of selection of the p-channel transistors or the number of selection of the n-channel transistors on the basis of the result of decision in the decision circuit.

3. A signal amplifier according to claim 2, wherein said decision circuit comprises first and second counter circuits either of count values of which is incremented in response to the result of comparison;
   said selection increment/decrement circuit comprises a first selection decode circuit for changing the number of selection of the p-channel transistors in response to the count value of the first counter circuit and a second selection decode circuit for changing the number of selection of the n-channel transistors in response to the count value of the second counter circuit.

4. A signal amplifier according to claim 3, wherein said first counter circuit increments a count value when the first driving capacity is high on the basis of the result of comparison, and said first selection decode circuit controls said selection circuit so as- to decrease the number of selection of the p-channel transistors in response to the count value of the first counter circuit; and
   wherein said second counter circuit increments a count value when the second driving capacity is high on the basis of the result of comparison, and said second selection decode circuit controls said selection circuit so as to decrease the number of selection of the n-channel transistors in response to the count value of the second counter circuit.

5. A signal amplifier according to claim 3, wherein said second counter circuit increments a count value when the first driving capacity is high on the basis of the result of comparison, and said second selection decode circuit controls said selection circuit so as to increase the number of selection of the n-channel transistors according to the count value of the second counter circuit;
   and wherein said first counter circuit increments a count value when the second driving capacity is high on the basis of the result of comparison, and said first selection decode circuit controls said selection circuit so as to increase the number of selection of the p-channel transistors according to the count value of the first counter circuit.

6. A signal amplifier according to claim 1, wherein said signal amplifier is a D-class signal amplifier.

7. A signal amplifier according to claim 1, wherein said inverter circuit is comprised of CMOS inverters connected to each other in multiple stages.

* * * * *